US006605974B2

(12) United States Patent
Brandt

(10) Patent No.: US 6,605,974 B2
(45) Date of Patent: Aug. 12, 2003

(54) LEVEL SHIFTER WITH GAIN

(75) Inventor: Per-Olof Brandt, Lomma (SE)

(73) Assignee: Telefonaktiebolaget LM Ericsson(Publ), Stockholm (SE)

( * ) Notice: Subject to any disclaimer, the term of this patent is extended or adjusted under 35 U.S.C. 154(b) by 0 days.

(21) Appl. No.: 09/918,735

(22) Filed: Jul. 31, 2001

(65) Prior Publication Data

US 2003/0025547 A1 Feb. 6, 2003

(51) Int. Cl.[7] .................................................. H03L 5/00
(52) U.S. Cl. ............................ 327/333; 326/68; 326/81
(58) Field of Search ................................ 327/333, 309, 327/312, 319; 326/62, 68, 80, 81

(56) References Cited

U.S. PATENT DOCUMENTS

| | | | | | |
|---|---|---|---|---|---|
| 4,392,067 | A | * | 7/1983 | Price, Jr. | 327/333 |
| 4,450,369 | A | | 5/1984 | Schuermeyer | 326/116 |
| 4,558,235 | A | | 12/1985 | White et al. | 326/116 |
| 4,663,543 | A | | 5/1987 | Sitch | 326/117 |
| 4,686,451 | A | * | 8/1987 | Li et al. | 323/313 |
| 4,697,110 | A | * | 9/1987 | Masuda et al. | 327/333 |
| 4,743,782 | A | * | 5/1988 | Nelson et al. | 327/333 |
| 4,760,284 | A | * | 7/1988 | Taylor | 327/333 |
| 4,844,563 | A | * | 7/1989 | MacMillan et al. | 327/333 |
| 4,857,769 | A | * | 8/1989 | Kotera et al. | 327/333 |
| 5,021,691 | A | * | 6/1991 | Saito | 327/333 |
| 5,208,488 | A | * | 5/1993 | Takiba et al. | 327/333 |
| 5,834,962 | A | * | 11/1998 | Okamoto | 327/333 |
| 5,903,177 | A | * | 5/1999 | Schwab et al. | 327/333 |

FOREIGN PATENT DOCUMENTS

| | | |
|---|---|---|
| EP | 0 314 476 A2 | 5/1989 |
| GB | 2 166 312 A | 4/1986 |

OTHER PUBLICATIONS

Standard Search Report issued by European Patent Office on Jan. 29, 2002.

* cited by examiner

*Primary Examiner*—Tuan T. Lam
(74) *Attorney, Agent, or Firm*—Jenkens & Gilchrist, P.C.

(57) ABSTRACT

A level shifting circuit for level shifting a control signal which sets a Gate voltage of a power amplifier includes circuitry for adding gain to the level shift. The addition of gain to the level shift causes the gate voltage to change faster than the control voltage, and this, in turn, makes it possible to get higher dynamics to control the Gate voltage of the power amplifier. When the circuitry is utilized in a power amplifier including a plurality of amplifier stages, problems associated with the output stage showing non-monotonic behavior can be avoided. The level shifting circuit is particularly useful in power amplifiers using MESFET transistors such as power amplifiers used in cellular telephones.

6 Claims, 2 Drawing Sheets

LEVEL SHIFTER WITH GAIN

BACKGROUND OF THE INVENTION

1. Field of the Invention

The present invention relates generally to the field of power amplifiers; and, more particularly, to a method and apparatus for level shifting the control signal that sets the Gate voltage in a power amplifier.

2. Description of the Prior Art

Cellular telephones used in mobile telecommunications systems; for example, mobile telecommunications systems which operate in accordance with GSM (Global System for Mobile Communications) specifications; contain a power amplifier for amplifying a transmitted signal. The power amplifier may include one or more stages which may be implemented by one or more MESFET (Metal Semiconductor Field Effect Transistor) transistors. In many power amplifiers, for example, in power amplifiers which use MESFETs, it is necessary to level shift the control signal which sets the Gate voltage of the power amplifier. The reason for this is that MESFETs have a negative pinch-off voltage (−2V is one example).

FIG. 1 illustrates a known circuit for level shifting the control signal of a power amplifier such as a power amplifier using MESFETs. In particular, FIG. 1 illustrates, a level shifting circuit (sometimes referred to herein as a "level shifter"), generally designated by reference number 10, which may be incorporated in the power amplifier system of a cellular telephone, schematically illustrated by dashed box 12. As shown in FIG. 1, the level shifting circuit 10 includes a control voltage (Vcontrol) 18, followed by a resister 20 having a resistance of 250 ohms, and a series of diodes 22 as are needed to achieve a desired voltage shift. In FIG. 1, circuit 10 includes four diodes 22*a*–22*d;* and each of the four diodes lowers the control voltage by approximately 0.6V.

In order to provide the desired voltage drop across each of the diodes 22*a*–22*d,* a current source 14 connects the last diode 22*d* of the series of diodes to a low voltage supply (Vneg) 24 of, for example, −3.6V. Because of the presence of the current source, the level shifter 10 is insensitive to changing Vneg. The voltage to the Gate is taken across the current source 14. In the exemplary circuit illustrated in FIG. 1, the current source 14 comprises a transistor 15 and is made by connecting the gate and source terminals 26 and 28, respectively, of the transistor to Vneg and the drain 30 of the transistor to the last diode 22*d* in the series of diodes 22.

In a cellular telephone that includes a power amplifier incorporating a level shifter such as level shifting circuit 10, a problem is encountered in that as the voltage in the telephone gets lower, the dynamics of the Vcontrol (maximum/minimum voltage) also gets lower. This is undesirable as it is important that control of the gate voltage remain the same as when there was a higher voltage in the telephone if the MESFET transistors are not changed.

Another problem with respect to using the level shifter illustrated in FIG. 1 is encountered in power amplifiers having more than one stage. In such power amplifiers, when ramping up the Gate voltages at the same slope, there is a risk that the output stage of the power amplifier could show a non-monotonic behavior when the RF-signal begins to saturate the MESFET transistor implementing the output stage. This is undesirable as it is important that the slope be monotonic in order for the power amplifier to be controllable with a power control circuit. This non-monotonic behavior comprises a dip in the Gate voltage, and is primarily caused by a high series resistance in the level shifter output impedance, and also because the input power increases too fast.

SUMMARY OF THE INVENTION

The present invention provides a level shifting circuit for level shifting a control signal that sets a Gate voltage of a power amplifier. A level shifting circuit according to the present invention includes circuitry for adding gain to the level shift.

By adding gain to the level shift according to the present invention, it becomes possible to obtain higher dynamics on the voltage control to thereby provide improved control of the Gate voltage of the power amplifier.

According to a presently preferred embodiment of the invention, the level shifting circuit includes a control voltage followed by a resister and at least one diode to achieve a desired voltage shift. A current source connects the last diode of the at least one diode to a low voltage supply. The circuitry for adding gain comprises a common gate amplifier connected to a portion of the control voltage and to the resister connected between the control voltage and the one or more diodes such that the current from the common gate amplifier is fed back to the resister. As a result, the change in the Gate voltage of the power amplifier can be made greater than the change in the control voltage.

The level shifting circuit according to the present invention can be advantageously used in a power amplifier that includes more than one stage. As indicated previously, in a multi-stage power amplifier, the output stage could show non-monotonic behavior, i.e., a dip in the gate voltage, when the RF-signal begins to saturate the MESFET transistor of the output stage; and this can interfere with the power amplifier being controllable by a power control circuit. By adding gain to the level shift, it is possible to still get to the optimum biasing point at full output power which is often at a higher voltage than where the dip occurs with a prior art circuit such as illustrated in FIG. 1.

Yet further advantages and specific features of the present invention will become apparent hereinafter in conjunction with the following detailed description of presently preferred embodiments of the invention.

DETAILED DESCRIPTION OF PRESENTLY PREFERRED EMBODIMENTS

Figure 2:
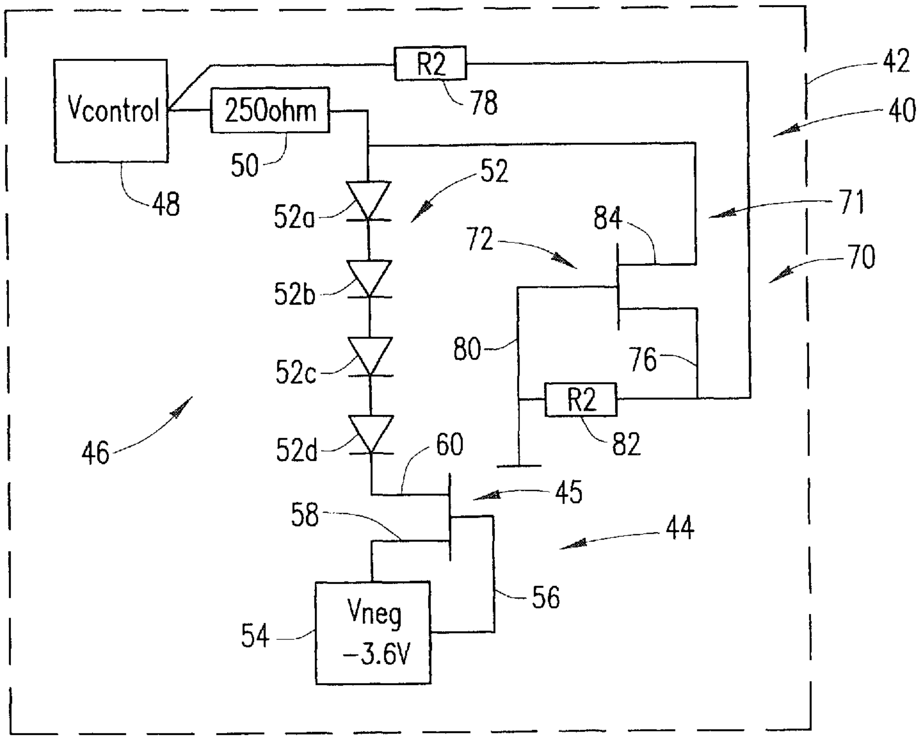
FIG. 2 illustrates a level shifting circuit according to a presently preferred embodiment of the present invention.

FIG. 2 illustrates a level shifting circuit for level shifting a control signal that sets the Gate voltage of a power amplifier according to a presently preferred embodiment of the invention. The level shifting circuit is generally designated by reference number 40 and may be utilized with a power amplifier of a cellular telephone, such as a cellular telephone used in mobile telecommunications systems which operate in accordance with GSM specifications, schematically illustrated by dashed box 42. The present invention is especially suitable for power amplifiers which use MESFET transistors although it should be understood that it is not intended to limit the invention in this regard as the invention may also be used in other applications where a level shifter is required.

Figure 1:
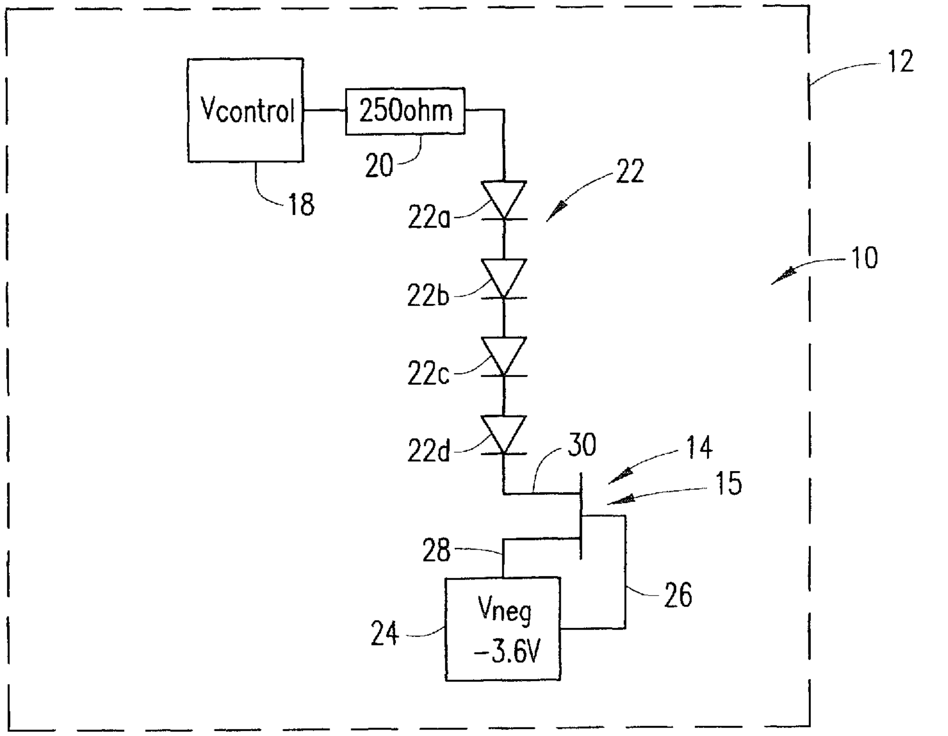
FIG. 1 (PRIOR ART)
FIG. 1 illustrates a known level shifting circuit for level shifting a control signal that sets the Gate voltage of a power amplifier.

Level shifting circuit 40 is similar to level shifting circuit 10 illustrated in FIG. 1 in that it includes a voltage control (Vcontrol) 48, followed by a resister 50 having a resistance of 250 ohms, and a series 52 of four diodes 52*a*–52*d*. (A series including four diodes is intended to be exemplary only, as the circuit may include one or more diodes as are needed to provide the desired voltage shift.) As was described with reference to the circuit of FIG. 1, each of the diodes 52*a*–52*d* lowers the control voltage by about 0.6V; and in order to provide the desired voltage drop across each of the diodes, a current source 44 is provided to connect the last diode 52*d* in the series 52 to a low voltage supply (Vneg) 54 of, for example, −3.6V. The current source is created by connecting the gate and source terminals 56 and 58 of a transistor 45 to Vneg 54, and connecting the drain terminal 60 to the last diode 52*d* in the series of diodes. By virtue of the current source 44, level shifting circuit 40 is insensitive to changing Vneg. The voltage to the Gate is taken across the current source.

The level shifting circuit 40 of FIG. 2 additionally includes circuitry for adding gain to the level shift provided by the circuit. In particular, the circuitry for adding gain to the level shift is generally designated by reference number 70 and includes a common gate amplifier 71 connected to a portion of the Vcontrol voltage and to the output of the resister 50. More specifically, common gate amplifier 71 comprises a transistor 72, the source terminal 76 of which is connected to a portion of the Vcontrol voltage via a resister 78 of, for example, 500 ohms. The source terminal and the portion of the control voltage are also connected to the gate terminal 80 via a resistor 82 of, for example, 1K ohms, The drain terminal 84 of the transistor 72 is connected to the output of the resister 50.

The circuitry 70 adds gain to the level shifter by connecting a portion of the Vcontrol voltage to the common gate amplifier and feeding its current back to the resister 50. As a result, the voltage drop across the resister 50 will change with changing Vcontrol voltage, and this permits the change in the Gate voltage of the MESFET power amplifier fed from drain terminal 60 of current source 44 to be made greater than the change in the Vcontrol voltage, i.e., the level shifted voltage will change faster than the Vcontrol voltage. The gain added to the level shift is set by the values of the resistors 78 and 82, by the 250 ohm resistor 50 and by the transistor 72.

By adding gain to the level shift according to the present invention, it becomes possible to obtain higher dynamics on the voltage control 48 to, in turn, better control the Gate voltage of the power amplifier even when the voltage of the telephone gets lower. This avoids the need to increase current consumption or decrease efficiency as is required when the prior art level shifter is used.

Figure 3:
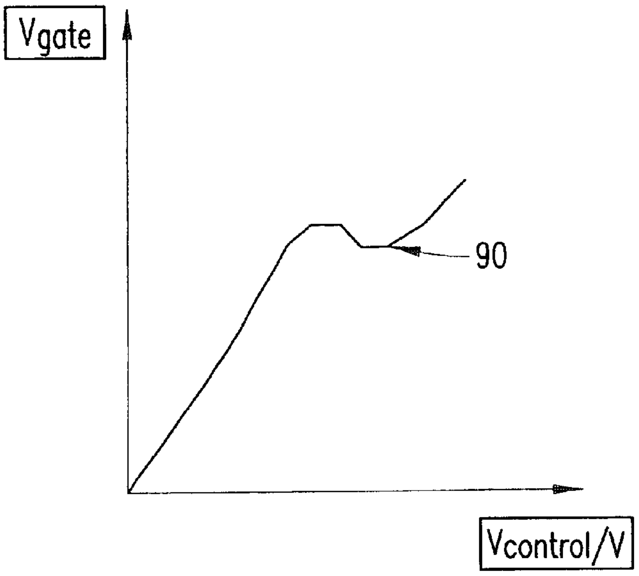
FIG. 3 is a graph schematically illustrating gate voltage versus control voltage for the output stage of a power amplifier having more than one stage and including a known level shifting circuit such as illustrated in FIG. 1.

The level shifter illustrated in FIG. 2 can be advantageously used in a power amplifier having more than one stage In a multi-stage power amplifier, the output stage may show non-monotonic behavior, i.e., a dip in the gate voltage, when the RF-signal begins to saturate the MESFET implementing the output stage. FIG. 3, for example, illustrates how a dip 90 in the Gate voltage of the output stage of the power amplifier may occur close to saturation when using a level shifting circuit such as illustrated in FIG. 1.

Figure 4:
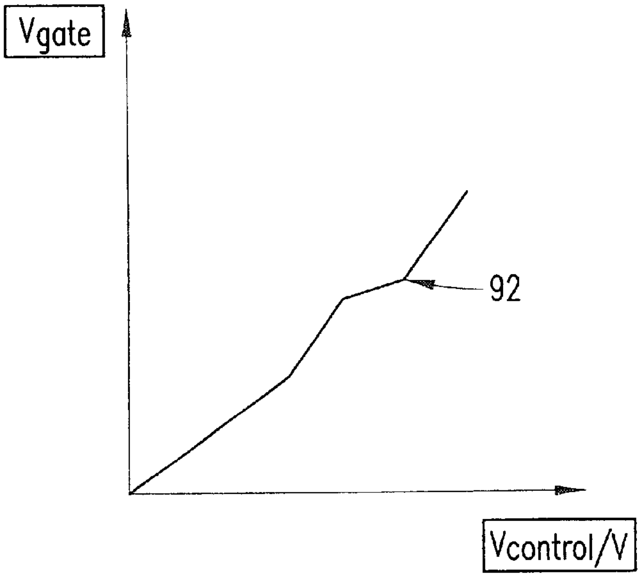
FIG. 4 is a graph schematically illustrating gate voltage versus control voltage for the output stage of a power amplifier having more than one stage and including a level shifting circuit such as illustrated in FIG. 2.

By adding gain to the level shift, however, the Gate voltage of the output stage will be as illustrated in FIG. 4 wherein the location 92 is the same location as location 90 in FIG. 3 where the voltage dip occurred. As is evident from FIG. 4, the voltage dip is eliminated and the situation is much improved. With the present invention, one is still able to get to the optimum biasing point at full output power which is often at a higher voltage than where the dip occurred without the added gain.

It should be emphasized that the term "comprises/comprising" when used in this specification is taken to specify the presence of stated features, integers, steps or components but does not preclude the presence or addition of one or more other features, integers, steps, components or groups thereof.

While what has been described herein constitutes presently preferred embodiments of the invention, it should be recognized that the invention can be varied in numerous ways without departing from the scope thereof. Accordingly, it should be understood that the invention should be limited only insofar as is required by the scope of the following claims.

What is claimed is:

1. A level shifting circuit for level shifting a control signal, said level shifting circuit comprising:

a current source, said current source including a drain terminal connected to said control signal via a first resistance and at least one diode for level shifting said control signal; and circuitry for adding gain to the level shift, said circuitry including a gate amplifier comprising a transistor, wherein a source terminal of said transistor is connected to a portion of said control signal via a second resistance, and a drain terminal of said transistor is connected to an output of the first resistance for feeding current back to the first resistance.

2. The level shifting circuit according to claim 1, wherein the portion of the control signal and the source terminal of said transistor are connected to a gate terminal of said transistor via a third resistance.

3. The level shifting circuit according to claim 2, wherein the gain is set by the first, second and third resistances and the transistor.

4. The level shifting circuit according to claim 1, wherein said level shifting circuit is incorporated in a cellular telephone.

5. A method for level shifting a control signal in a level shifting circuit, said level shifting circuit including a current source, said current source including a drain terminal connected to said control signal via a first resistance and at least one diode for level shifting said control signal; the method comprising adding gain to the level shift by feeding a current back to the first resistance, wherein said step of adding gain to the level shift comprises feeding said current back to the first resistance through a transistor having a source terminal connected a portion of said control signal via a second resistance, and a drain terminal connected to an output of the first resistance.

6. The method according to claim 5, wherein said level shifting circuit is incorporated in a cellular telephone.

* * * * *

UNITED STATES PATENT AND TRADEMARK OFFICE

CERTIFICATE OF CORRECTION

PATENT NO. : 6,605,974 B2 
DATED : August 12, 2003
INVENTOR(S) : Per-Olof Brandt It is certified that error appears in the above-identified patent and that said Letters Patent is hereby corrected as shown below:

Drawings,
Figure 2, replace "R2" with -- R1 --

Column 4,
Line 61, replace "connected a portion" with -- connected to a portion --

Signed and Sealed this

Fourth Day of May, 2004

JON W. DUDAS
*Acting Director of the United States Patent and Trademark Office*